United States Patent [19]

Nishiguchi et al.

[11] Patent Number: 5,348,214
[45] Date of Patent: * Sep. 20, 1994

[54] METHOD OF MOUNTING SEMICONDUCTOR ELEMENTS

[75] Inventors: Masanori Nishiguchi; Atsushi Miki, both of Kanagawa, Japan

[73] Assignee: Sumitomo Electric Industries, Ltd., Osaka, Japan

[*] Notice: The portion of the term of this patent subsequent to Sep. 14, 2010 has been disclaimed.

[21] Appl. No.: 12,369

[22] Filed: Feb. 2, 1993

Related U.S. Application Data

[62] Division of Ser. No. 794,869, Nov. 19, 1991, Pat. No. 5,244,142.

[30] Foreign Application Priority Data

Nov. 20, 1990 [JP] Japan ............................ 2-312665
Nov. 20, 1990 [JP] Japan ............................ 2-312666
Nov. 20, 1990 [JP] Japan ............................ 2-312667

[51] Int. Cl.[5] .................... B23K 31/02; H05K 3/34
[52] U.S. Cl. .................... 228/180.22; 29/841; 257/796; 257/722
[58] Field of Search ............ 228/175, 180.2, 123, 228/187, 188, 180.22; 29/841; 257/796, 722, 738; 437/DIG. 902

[56] References Cited

U.S. PATENT DOCUMENTS

| | | | |
|---|---|---|---|
| 4,292,647 | 9/1981 | Lee | 357/81 |
| 4,604,644 | 8/1986 | Beckham et al. | 228/180.2 X |
| 4,620,215 | 10/1986 | Lee | 257/722 X |
| 4,770,242 | 9/1988 | Daikoku et al. | 357/81 X |
| 4,825,284 | 4/1989 | Soga et al. | 357/80 |
| 4,831,724 | 5/1989 | Elliott | 228/180.22 |
| 4,908,696 | 3/1990 | Ishihara et al. | 257/722 X |
| 4,939,570 | 7/1990 | Bickford et al. | 257/722 |
| 4,964,458 | 10/1990 | Flint et al. | 257/722 X |
| 4,967,950 | 11/1990 | Legg et al. | 228/180.2 |
| 5,001,548 | 3/1991 | Iverson | 357/81 |
| 5,005,638 | 4/1991 | Goth et al. | 357/81 |
| 5,024,264 | 6/1991 | Natori et al. | 357/81 |
| 5,121,190 | 6/1992 | Hsiao et al. | 228/180.2 X |
| 5,203,075 | 4/1993 | Angulas et al. | 228/180.22 |

FOREIGN PATENT DOCUMENTS

| | | | |
|---|---|---|---|
| 0344702 | 12/1989 | European Pat. Off. | |
| 2555812 | 5/1985 | France . | |
| 59-065458 | 4/1984 | Japan . | |
| 60-137041 | 7/1985 | Japan | 257/796 |
| 63-252432 | 10/1988 | Japan . | |
| 1-232734 | 9/1989 | Japan | 228/175 |

*Primary Examiner*—P. Austin Bradley
*Assistant Examiner*—Jeanne M. Elpel
*Attorney, Agent, or Firm*—Cushman, Darby & Cushman

[57] ABSTRACT

A method of mounting a plurality of semiconductor elements each having bump electrodes on a wiring board by pressing the semiconductor elements to the wiring board while aligning the electrodes and heating the structure. In the mounting method, one or more heat sinks are previously joined to the backs opposite to the surfaces with the bump electrodes formed thereon of the semiconductor elements.

2 Claims, 2 Drawing Sheets

METHOD OF MOUNTING SEMICONDUCTOR ELEMENTS

This is a division of application Ser. No. 07/794,869, filed Nov. 19, 1991, now U.S. Pat. No. 5,244,142.

BACKGROUND OF THE INVENTION

1. Field of the Invention

The present invention relates to a method of mounting a plurality of semiconductor elements on a wiring board.

2. Description of the Related Art

When a plurality of semiconductor elements are joined to a wiring board by face down bonding, the following method has been carried out conventionally. That is, the plurality of semiconductor elements are mounted on the wiring board by pressing the plurality of semiconductor elements having bump electrodes with soldering bumps formed thereon to the wiring board while aligning the electrodes to fix them temporarily and then heat-melting the soldering bumps.

As the heat produced in the semiconductor element thus mounted is compelled to escape via the bump electrodes toward the wiring board, the thermal resistance has been extremely high.

This has posed a serious problem particularly when the power consumption of such a semiconductor element is large.

As a result, there has generally been employed a method of providing a heat sink as a radiation path for semiconductor elements ("Handbook of Semiconductor Mounting Technique" compiled by Koshi Nihei, Masao Hayakawa and Fumio Miyashiro, K. K. Science Forum (1986)).

However, the above method is still problematical because the heat sink is joined to a plurality of semiconductor elements after the elements are joined to a wiring board by face down bonding. In other words, slants of the semiconductor elements, variations of their thickness and the like tend to cause bad contact between the heat sink and the semiconductor elements.

SUMMARY OF THE INVENTION

The present invention has been made in view of the foregoing problems in the conventional method and an object of the invention is therefore to provide a method of mounting semiconductor elements which ensures that a plurality of semiconductor elements to be mounted on a wiring board by face down bonding are made to contact respective radiation fins or heat sinks to reduce their thermal resistance.

In order to accomplish the above object, a method of mounting semiconductor elements according to the present invention comprises the steps of providing a plurality of semiconductor elements each having bump electrodes, joining radiation means to backs opposite to surfaces with the bump electrodes formed thereon of the semiconductor elements, pressing the semiconductor elements to a wiring board while aligning the bump electrodes, and heating to mount the semiconductor elements on the wiring board.

Since the bump electrodes are joined to electrodes on the wiring board by face down bonding after the radiation means is joined to the backs opposite to the surfaces with the bump electrodes formed thereon of the semiconductor elements, the radiation means and the semiconductor elements are made to contact certainly even though the semiconductor elements vary in thickness or slant, so that the thermal resistance therebetween is reduced.

BRIEF DESCRIPTION OF THE DRAWINGS

FIG. 2 illustrates a process of joining semiconductor elements to a heat sink; and FIG. 3 illustrates a process of joining the semiconductor elements to a wiring board by face down bonding.

FIG. 4 illustrates a process of joining semiconductor elements to a wiring board by face down bonding; and FIG. 5 illustrates self-alignment of the semiconductor elements.

DETAILED DESCRIPTION OF THE PREFERRED EMBODIMENTS

Hereinafter, three embodiments of the present invention will be described in detail with reference to the accompanying drawings.

First Embodiment

Figure 1:
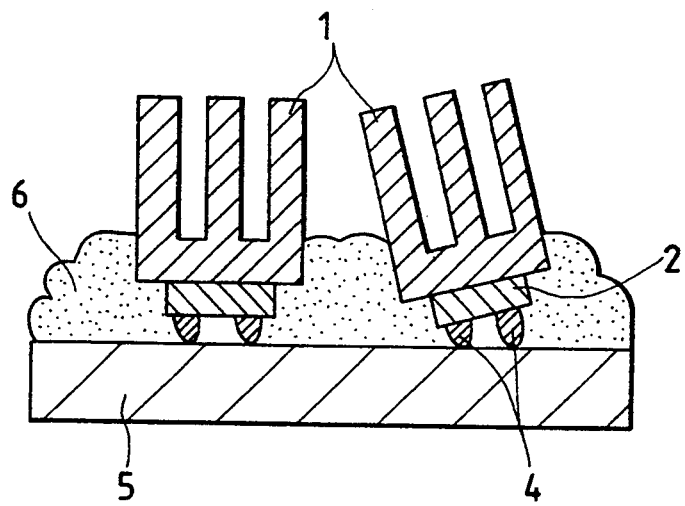
FIG. 1 is an explanatory diagram for explaining a method of mounting semiconductor elements according to a first embodiment of the present invention.

First, as shown in FIG. 1, heat sinks 1 are joined to a plurality of semiconductor elements 2, respectively.

As bump electrodes with soldering bumps 4 formed thereon are arranged on the surface of each semiconductor element 2, the heat sink 1 is joined to the back on the opposite side thereof.

In this case, AuSn or the like is used to join the semiconductor elements 2 to the respective heat sinks 1 respectively.

Then the plurality of semiconductor elements 2 are joined to a wiring board 5 by face down bonding.

More specifically, the semiconductor elements 2 are mounted on the wiring board 5 by pressing the semiconductor elements 2 to the wiring board 5 while aligning the electrodes to fix them temporarily and then heat-melting the soldering bumps 4.

Subsequently, molding resin 6 is formed among the wiring board 5, the semiconductor elements 2 and the heat sinks 1 so as to reinforce them.

A resin material having good thermal conductivity is suitable for the molding resin 6.

As seen from the foregoing description, the heat sinks 1 and the semiconductor elements 2 are previously joined to each other before the semiconductor elements 2 and the wiring board 5 are joined by face down bonding to ensure that the semiconductor elements 2 come in contact with the heat sinks 1, so that thermal resistance therebetween becomes reducible in this way.

Even though the plurality of semiconductor elements 2 differ in thickness or they are mounted on the wiring board 5 while being slanted, the contacts between the semiconductor elements 2 and the heat sinks 1 are established for certain.

Accordingly, even though the power consumption of the semiconductor elements 2 mounted on the wiring board 5 is large, the heat generated therefrom is allowed to quickly escape from the heat sinks 1. Reliability of the elements is thus improved.

Further, since the semiconductor elements 2 and the wiring board 5 are reinforced with the molding resin 6, no deficiency in their strength arises.

Although the molding resin has been used in the above embodiment, the use of such molding resin may be omitted if the soldering bumps 4 provide satisfactory junctions.

Although the soldering bumps 4 have been used in the above embodiment, Au, AuSn, In bumps or the like may be used instead.

Second Embodiment

Figure 2:
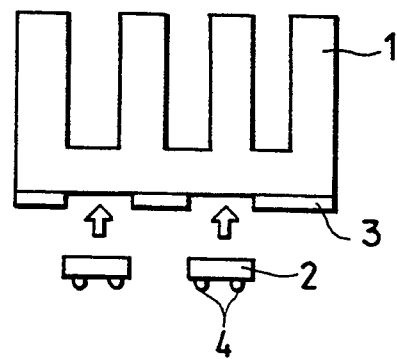
FIGS. 2 and 3 are explanatory diagrams for explaining a method of mounting semiconductor elements according to a second embodiment of the present invention.

First, as shown in FIG. 2, a resist pattern 3 is formed on the undersurface of a heat sink 1 for use as a radiation fin.

The resist pattern 3 is used for aligning a plurality of semiconductor elements 2 and formed by photolithography, for instance.

For this reason, the shape of an opening of the resist pattern 3 is rendered consistent with the exterior of each semiconductor element and the openings are provided corresponding to positions where the semiconductor elements are subjected to face down bonding.

On the other side, a plurality of bump electrodes with soldering bumps 4 projectively formed thereon are disposed on the surface of each semiconductor element 2.

Subsequently, as shown in FIG. 2, the backs of the semiconductor elements 2 opposite to the surfaces with the bump electrodes formed thereon are positioned on and joined to the heat sink 1.

In this case, AuSn or the like is used to join the semiconductor elements 2.

Figure 3:
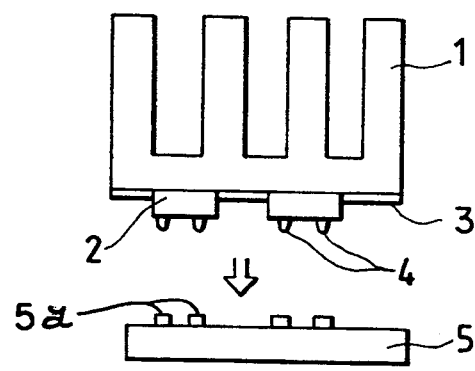

Then the plurality of semiconductor elements 2 are joined to a wiring board 5 by face down bonding as shown in FIG. 3.

More specifically, the semiconductor elements 2 are mounted on the wiring board 5 by pressing the semiconductor elements 2 to the wiring board 5 while aligning the electrodes to fix them temporarily and then heat-melting the soldering bumps 4. As can be seen in FIG. 3, the electrodes 5a on wiring board 5 are of a convex shape.

As seen from the foregoing description, the heat sink 1 and the plurality of semiconductor elements 2 are previously joined together before the semiconductor elements 2 and the wiring board 5 are joined by face down bonding to ensure that the semiconductor elements 2 come in contact with the heat sink 1 without slants of all the surfaces of the semiconductor elements 2 against the corresponding surface of the heat sink 1, so that the thermal resistance therebetween is reducible in this way.

Accordingly, even though the power consumption of the semiconductor elements 2 mounted on the wiring board 5 is large, the heat generated therefrom is allowed to quickly escape from the heat sink 1. Reliability of the elements is thus improved.

The resist pattern has been used to position the plurality of semiconductor elements relative to the heat sink in this embodiment. However, provided the relative position between the semiconductor elements and the heat sink is determined certainly, the use of the resist pattern may be omitted.

Third Embodiment

Figure 4:
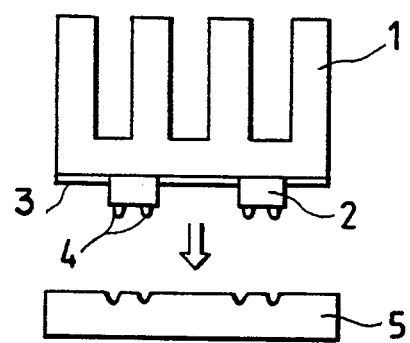
FIGS. 4 and 5 are explanatory diagrams for explaining a method of mounting semiconductor elements according to a third embodiment of the present invention.
Figure 5:
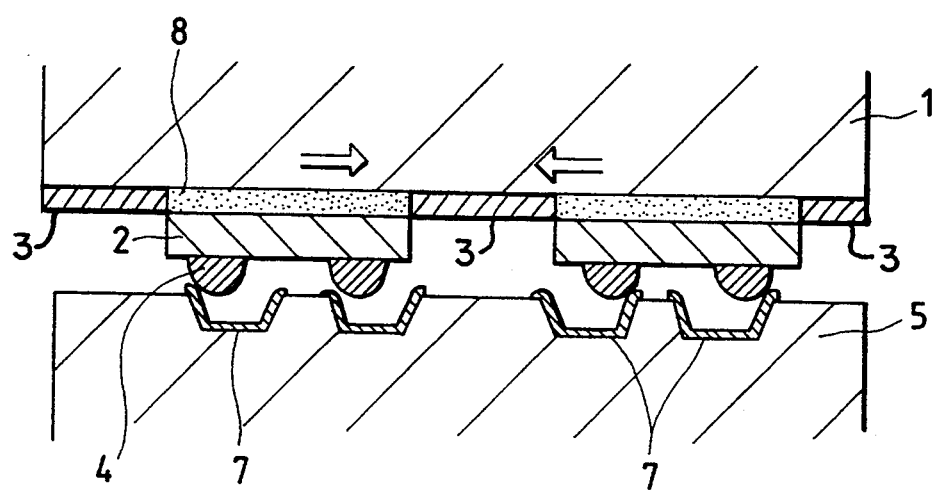

In this embodiment as shown in FIGS. 4 and 5, a resist pattern 3 is formed on the undersurface of a heat sink 1 and a plurality of semiconductor elements 2 are joined to the heat sink 1, in the same manner as in the second embodiment.

However, solder 8 (see FIG. 5) having a melting point lower than that of soldering bumps 4 is used to join the semiconductor elements 2.

The positioning accuracy of the semiconductor elements 2 may be defined liberally: e.g., ±50 $\mu$m in this embodiment instead of ±10 $\mu$m conventionally specified for a bump having a diameter of 80 $\mu$m and an electrode of wiring board 5 having a diameter of 100 $\mu$m.

Then the semiconductor elements 2 are joined to the wiring board 5 by face down bonding as shown in FIG. 4.

More specifically, the semiconductor elements 2 are mounted on the wiring board 5 by pressing the semiconductor elements 2 to the wiring board 5 while aligning the electrodes to fix them temporarily and then heat-melting the soldering bumps 4.

Even if the semiconductor elements 2 are accurately positioned relative to the wiring board 5 at this stage, the semiconductor elements are self-aligned and automatically moved to respective accurate positions for mounting.

In other words, a plurality of recessed or concave electrodes 7 are bored in the wiring board 5 and as these electrodes 7 correspond in position to the soldering bumps 4 of the respective bump electrodes, the electrodes 7 and the bumps 4 are unable to fit together completely unless they are perfectly held in position.

The soldering bumps 4 will fail to fit into the recessed electrodes 7 completely as shown in FIG. 5 if the positioning accuracy of both is at approximately ±50 $\mu$m. However, the semiconductor elements 2 are temporarily fixed to the wiring board 5 in such a state that the leading ends of the soldering bumps remain fitted in the electrodes 7, and the force of moving the soldering bumps to the center positions of the electrodes in that state.

When heating is applied subsequently, the low melting point solder 8 melts before the soldering bumps 4 melt and the semiconductor elements 2 are caused to slide on the heat sink 1 into accurate positions respectively due to the force of moving the soldering bumps 4 to the center positions of the recessed electrodes 7.

Thereafter, if heating is continuously applied, the solder bumps 4 melt, whereby the recessed electrodes 7 and the bump electrodes become joined.

When heating is stopped later, the solder bumps solidify first and then the low melting point solder 8 solidifies.

As seen from the foregoing description, the heat s ink 1 and the semiconductor elements 2 are joined before the semiconductor elements 2 and the wiring board 5 are joined by face down bonding to ensure the contact between the semiconductor elements 2 and the heat sink 1, so that thermal resistance therebetween is reduced.

Moreover, as the semiconductor elements are moved automatically by self-alignment to respective accurate positions relative to the wiring board, no high-accurate positioning technique is required. With this arrangement, the mounting time is shortened, thus improving reliability.

What is claimed is:

1. A method of mounting semiconductor elements comprising the steps of:

providing a plurality of semiconductor elements, each of said semiconductor elements having first and second surfaces and having bump electrodes on said first surface;

forming a resist pattern on heat sinks to align said semiconductor elements with said heat sinks;

joining said heat sinks to said second surfaces;

pressing said semiconductor elements, with said heat sinks joined thereon to a wiring board having electrodes, while aligning said bump electrodes to correspond with the wiring board electrodes;

heating said bump electrodes and said wiring board to mount said semiconductor elements on said wiring board; and applying a molding resin to said wiring board, said semiconductor elements and said heat sinks.

2. A method as in claim 1 wherein the wiring board electrodes are concavities and said pressing and electrode aligning includes pressing said bump electrodes into said concavities.

* * * * *